United States Patent [19]
Elliott et al.

[11] Patent Number: 5,016,073
[45] Date of Patent: May 14, 1991

[54] PHOTODETECTOR SEMICONDUCTOR WHICH DOES NOT REQUIRE EXTENSIVE COOLING

[75] Inventors: Charles T. Elliott, Malvern; Timothy Ashley, Malvern Link, both of England

[73] Assignee: The Secretary of State for Defence in Her Britannic Majesty's Government of the United Kingdom of Great Britain and Northern Ireland, London, England

[21] Appl. No.: 600,126

[22] Filed: Oct. 22, 1990

Related U.S. Application Data

[63] Continuation of Ser. No. 323,096, Mar. 7, 1989, abandoned, which is a continuation of Ser. No. 127,718, Dec. 2, 1987, abandoned, which is a continuation of Ser. No. 42,016, Apr. 24, 1987, abandoned, which is a continuation of Ser. No. 749,936, Jun. 17, 1985, abandoned.

[30] Foreign Application Priority Data

Jul. 6, 1984 [GB] United Kingdom ............... 8417303

[51] Int. Cl.[5] ........................................... H01L 27/14
[52] U.S. Cl. ...................................... 357/30; 357/16; 357/58; 357/90
[58] Field of Search .................. 357/63, 16, 58, 61, 357/90, 30 B, 30 E, 30 F, 30 L, 30 P

[56] References Cited

U.S. PATENT DOCUMENTS

| | | | |
|---|---|---|---|
| 4,085,500 | 4/1978 | Hager et al. | 357/81 X |
| 4,107,722 | 8/1978 | Chamberlain | 357/30 |
| 4,144,540 | 3/1979 | Bottka | 357/30 |
| 4,250,516 | 2/1981 | Worlock | 357/16 |
| 4,273,596 | 6/1981 | Gutierrez et al. | 357/81 X |
| 4,341,918 | 7/1982 | Evans, Jr. et al. | 357/39 X |
| 4,357,620 | 11/1982 | Wang et al. | 357/61 X |
| 4,376,659 | 3/1983 | Castro | 357/16 X |

FOREIGN PATENT DOCUMENTS

| | | |
|---|---|---|
| 0026629 | 4/1981 | European Pat. Off. |
| 3015526 | 11/1980 | Fed. Rep. of Germany |
| 3015527 | 11/1980 | Fed. Rep. of Germany |
| 3221335 | 1/1983 | Fed. Rep. of Germany |
| 2262865 | 9/1975 | France |
| 2053567 | 2/1981 | United Kingdom |

OTHER PUBLICATIONS

Arthur et al, "Carrier Extraction in Germanium," Proc. Phys. Soc. LXVIII, I-B, (1954) London, pp. 43–50.
No Arthur, RCA Power Transistors, Technical Series PM-81, RCA 1971, pp. 22 & 28.
Manifacier et al, "Minority Carrier Exclusion," Solid State Electronics vol. 22, 1979, pp. 279–281.
Vikulin et al, "Modulation of the Bulk Conductivity of a Semiconductor Rod by Means of the Exclusion Effect," Radio Eng, and Electron Physcis, U.S.A., vol. 19, No, 10, Oct. 1974, pp. 78–84.
Bray, "Minority Carrier Extractio in Germanium," Physical Review, vol. 100, No. 4, Nov. 15, 1955, pp. 1047–1055.
Lanin et al, "Backside-Illuminated HgCaTe/CdTe Photodiodes," Applied Physcis Letters, vol. 34, No. 1 (1979.01), pp. 50–52, Jan. 1979.
Sood et al, "Improved Performance of Implanted $N^+$-$pHg_{1-x}Cd_xTe$ Photodiodes Using Insulated Field Plates," IEEE Electron Devices Letters, vol. EDL-1 (1980) pp. 12–14, Jan. 1980.

Primary Examiner—William Mintel
Attorney, Agent, or Firm—Nixon & Vanderhye

[57] ABSTRACT

A photodetector of semiconductor material includes a photosensitive region adjacent to a minority carrier extraction region arranged when biased to depress the photosensitive region minority carrier concentraction, and means for inhibiting injection of minority carriers to the photosensitive region. Depression of the minority carrier concentration produces low noise and high responsivity properties as obtained by cooling, but without the need for cooling equipment. The minority carrier extraction region may be a pn homo- or heterojunction. Minority carrier injection may be inhibited by a homo- or hetero-structure excluding contact to the photosensitive region, or alternatively by providing the photosensitive region with at least one subsidiary pn junction biasable to inhibit minority carrier flow. The photosensitive region may have an array of extraction regions spaed by less than a minority carrier diffusion length. The extraction regions may have separate outputs to provide respective pixels in a display.

7 Claims, 3 Drawing Sheets

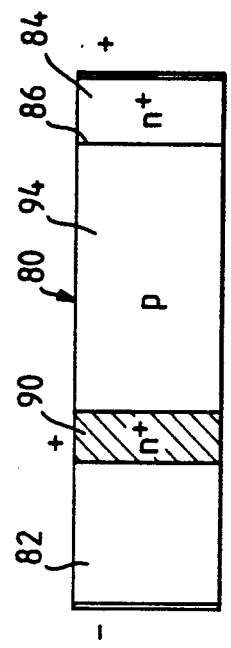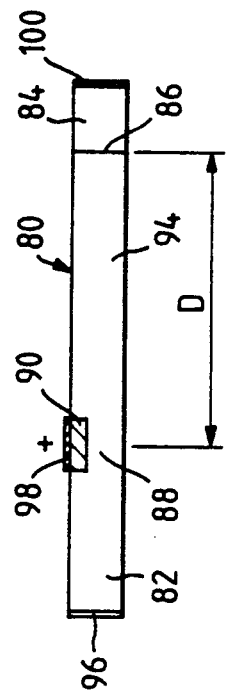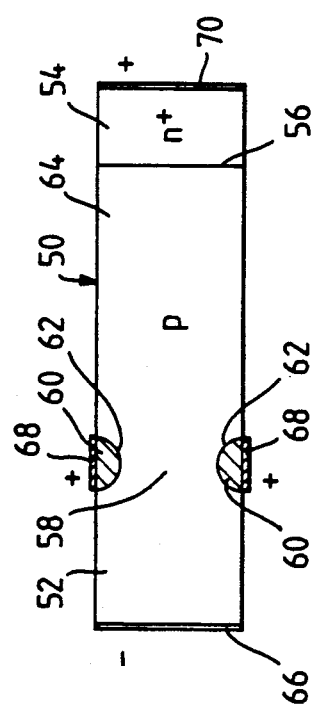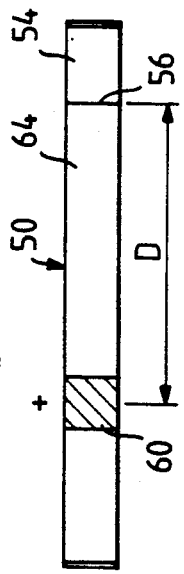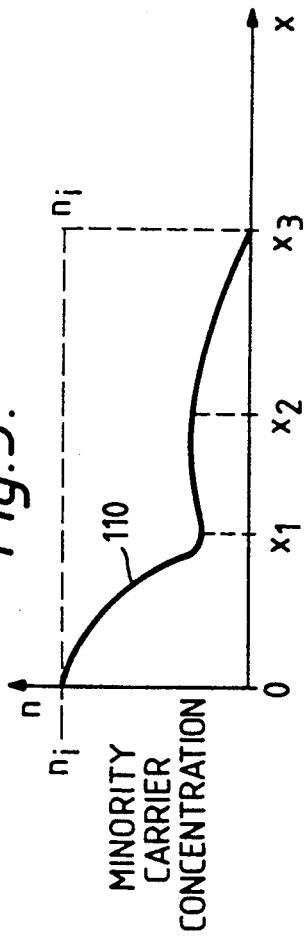

PHOTODETECTOR SEMICONDUCTOR WHICH DOES NOT REQUIRE EXTENSIVE COOLING

This is a continuation of application Ser. No. 07/323,096, filed Mar. 7, 1989, now abandoned; which is a continuation of application Ser. No. 07/127,718 filed Dec. 2, 1987, now abandoned; which is a continuation of application Ser. No. 07/042,016 filed Apr. 24, 1987, now abandoned, which is a continuation of application Ser. No. 06/744,936, filed June 17, 1985, now abandoned.

BACKGROUND OF THE INVENTION

1. Field of the Invention

This invention relates to a photodetector of semiconductor material, and especially but not exclusively to an infrared photodetector.

2. Discussion of Prior Art

Semiconducting infrared detectors are well known, such as for example those of cadmium mercury telluride (CMT). They are normally operated in an extrinsic regime in which the equilibrium majority carrier concentration greatly exceeds the intrinsic carrier concentration. To achieve this, CMT detectors sensitive in the 8-12 μm and 3-5 μm wavelength intervals are normally cooled to about 80° K. and 200° K. respectively. One advantage of this is that responsivity is high because a large fractional change in carrier density results from exposure to infrared radiation. Moreover, the signal-to-noise ratio is high because the noise due to fluctuations in the equilibrium carrier density is low. This noise benefit is particularly significant with respect to Auger generation-recombination processes. In these the principal process is electron-hole pair production by electron-impact ionisation, the ionising electrons having thermal energy greater than the relevant semiconductor band gap.

SUMMARY OF THE INVENTION

The requirement to cool infrared detectors leads to considerable inconvenience and expense, particularly as regards devices requiring cooling to 80° K.

It is an object of the present invention to provide an infrared detector having reduced cooling requirements as compared to the prior art.

The present invention provides a photodetector of semiconducting material having a photosensitive region adjacent a minority carrier extraction region arranged when biased to depress the photosensitive region minority carrier concentration, and means for inhibiting injection of minority carriers to the photosensitive region. The invention is particularly suitable for infra-red detection.

As has been mentioned, in order to operate infra-red detectors in the extrinsic regime, it has been previously necessary to provide complex, bulky and expensive detector cooling apparatus. However, the present invention makes it possible to reduce cooling requirements significantly. The photosensitive detector region of a device of the invention experiences in operation a reduction in minority carrier concentration by virtue of the adjacent extraction region removing minority carriers from it on the one hand, and also by virtue of injected minority carriers being inhibited from reaching it on the other. This is equivalent to the effect achieved by cooling to reduce the intrinsic contribution to conduction, since space charge considerations require the intrinsic contribution to the majority carrier concentration to be equal to and reduced with the minority carrier concentration. The reduction in the photosensitive region minority carrier concentration produced by the invention takes place under bias. It is accordingly a dynamic effect occurring during operation, as opposed to the static effect produced by cooling. The latter produces a reduction in minority carrier concentration with or without application of device bias.

In a preferred embodiment, the minority carrier extraction region is a pn junction between first and second regions of opposite majority carrier types the first region incorporating the photosensitive region which extends substantially one minority carrier diffusion length from the junction. In this embodiment the invention may be referred to as an Auger-suppressed diode, since Auger processes are reduced by minority carrier reduction.

The first region may have a bias contact and inhibiting means such as one or more subsidiary biasable pn junctions arrange to inhibit minority carrier injection into the first region. In this case the first and second regions may be of the same semiconductor material with differing dopant species. Moreover, in this embodiment the invention may incorporate a plurality of second regions each associated with respective photosensitive and minority carrier extraction regions and each providing inhibiting means for its respective neighbors. The photosensitive regions preferably have a nearest neighbour separation much less than a minority carrier diffusion length. The material of the first and second regions may be $Cd_xHg_{1-x}Te$ (CMT) with $x=0.265$ or $0.19$ for operation at ambient temperature (cut-off wavelength $=5$ μm) or 200° K. ($\lambda_c=11$ μm) respectively. The prior art equivalent operating temperatures for related devices would be 200° K. and 80° K. respectively, thus demonstrating the reduced cooling requirements obtainable in accordance with the invention.

The first region may alternatively have a bias contact arranged when biased to exclude minority carriers from the first region. Excluding contacts are known, as set out for example by Arthur et al., Proc. Phys. Soc. LXVIII 1-B, pp. 43-50 (1954) in relation to Germanium. The characteristics of such a contact are that minority carriers are excluded from a region adjacent the contact when biased. The excluding contact may be provided by forming a degenerately doped region in and of the same conductivity type as the first region; i.e. the degenerately doped region is n+ or p+ according to whether the first region is n or p type respectively, and an n+n or p+p structure is formed. The excluding contact may alternatively be a heterojunction structure produced by providing the first region with a layer of a different and wider band gap semiconductor material of like majority carrier types; i.e. the structure would be nn or pp according to whether the first region is n or p type respectively, the subscript bar in p or n indicating the wider band gap material. Examples of this include $Cd_xHg_{1-x}Te$ (CMT) where the compositional parameter x differs in the two regions.

The minority carrier extraction region may be a pn heterojunction of gradual composition change (graded construction) to avoid a barrier to conduction.

In one embodiment, the invention may comprise a first region of a first CMT material together with an excluding contact and a second region of a second CMT material, the first region providing the photosensitive region.

BRIEF DISCUSSION OF THE DRAWINGS

In order that the invention might be more fully understood, one embodiment thereof will now be described, by way of example only, with reference to the accompanying drawings, in which.

Figure 6:
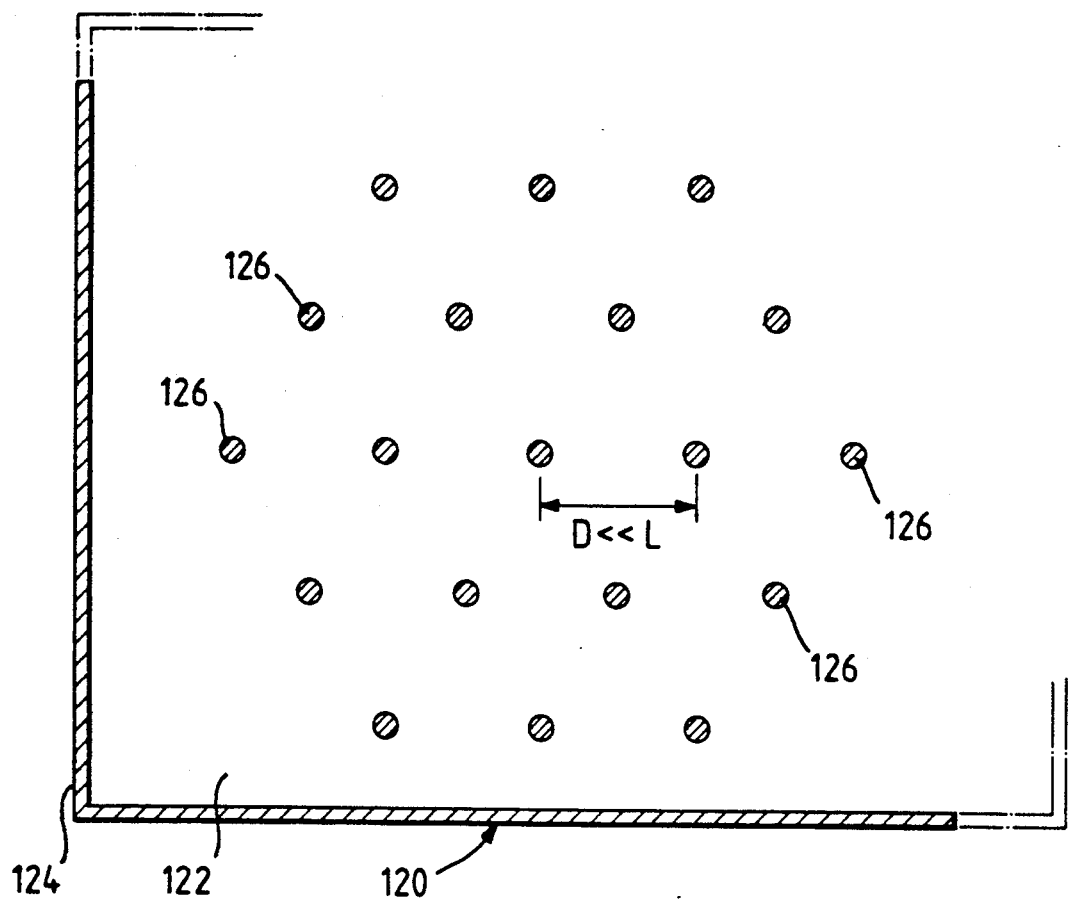
Figure 7:
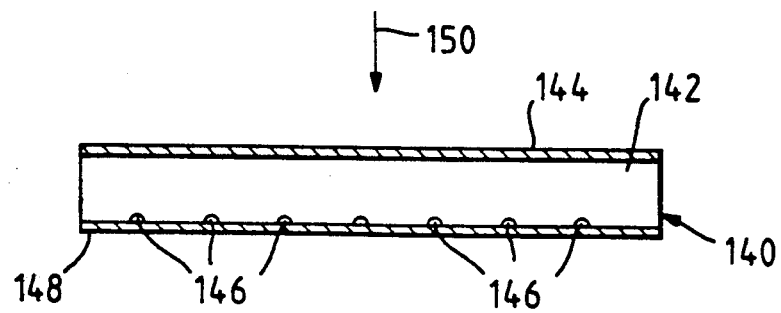

FIGS. 3a, 3b, 4a, and 4b show plan and side elevations of photodetectors of the invention;

FIG. 5 shows a schematic graph of minority carrier concentration along the FIG. 3 device; and FIGS. 6 and 7 show further photodetectors of the invention, these having multiple extracting contacts.

DETAILED DISCUSSION OF PREFERRED EMBODIMENTS

Figure 1:
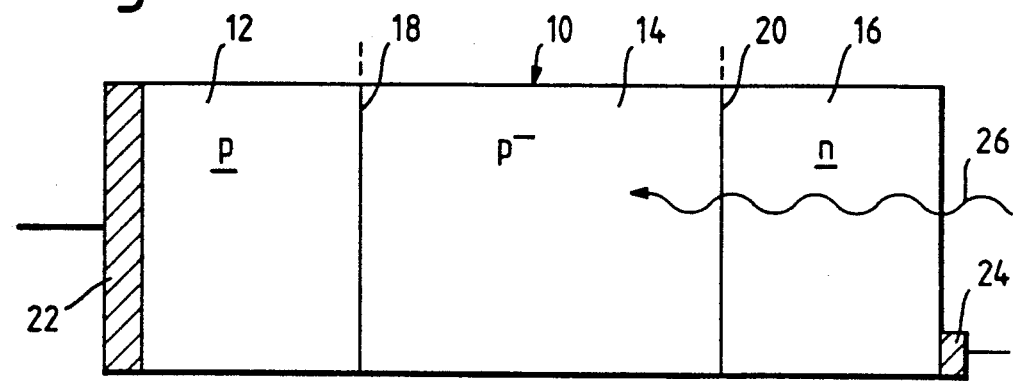
FIG. 1 is a schematic drawing of an infrared detector of the invention.

Referring to FIG. 1, there is shown an infra-red detector diode 10 consisting of a heterostructure of cadmium mercury telluride alloys. The diode 10 has a p region 12, a lightly doped p-type or p+ photosensitive region 14 and an n-type or n region 16. The regions 12, 14 and 16 have intermediate regions at 18 and 20 which are pp and p−n heterojunctions respectively. The bar (−) subscript indicates a junction between dissimilar materials, of which n or p indicates the material of higher energy gap. As will be described, the pp heterojunction 18 is an excluding contact inhibiting minority carrier injection from region 12 to region 14, which is arranged to be the active photosensitive region. Moreover, the p−n heterojunction 20 is an extraction region which extracts minority carriers from the photosensitive region 14 within a diffusion length of the former. The region 14 is accordingly arranged to be less than or substantially equal to a minority carrier diffusion length in extent between heterojunctions 18 and 20. Electrodes to the diode 10 are provided at 22 and 24 for bias voltage application. The diode 10 is arranged to detect infra-red photons passing longitudinally into region 14 via region 16, as indicated by arrow 26.

The diode material has the alloy composition $Cd_xHg_{1-x}Te$. where the compositional parameter x varies between regions 12, 14 and 16. The Parameter x also depends on the required diode operating temperature and optical cut-off wavelength $\lambda_c$. Table 1 sets out the values of x appropriate for the materials of the regions 12, 14 and 16 at diode operating temperatures of 295° K. and 190° K. Corresponding values of cut-off wavelengths are also given.

| Operating Temperature | Compositional Parameter x | |
|---|---|---|
| | 295° K. | 190° K. |
| Regions 12 and 16 | ≳0.45 ($\lambda_c < 2.5$ μm) | ≳0.27 ($\lambda_c = 5.5$ μm) |
| Region 14 | 0.265 ($\lambda_c \approx 5.0$ μm) | 0.19 ($\lambda_c = 11.0$ μm) |

In region 12, the doping level is arranged to be high enough to obtain minority carrier exclusion, i.e., to avoid electric fields driving minority carriers (electrons) from the contact 22 to the pp heterojunction 18. This is satisfied if $[N_A]-[N_D] \gtrsim 1 \times 10^{17} cm^{-3}$. The doping level in region 14 is sufficiently low to produce near intrinsic characteristics at the diode operating temperature and under zero bias conditions. This requires $[N_A]-[N_D] \lesssim 1 \times 10^{16} cm^{-3}$. In region 16 the doping level is sufficiently high for the material to be extrinsic in nature at the diode operating temperature in order to obtain minority carrier extraction, i.e. to obtain a low reverse saturation current at the pn heterojunction 20. This is at least satisfied by $[N_D]-[N_A] \gtrsim 1 \times 10^{16} cm^{-3}$.

Region 12 is arranged to be sufficiently long that minority carriers (electrons) injected from the contact 22 fail to reach the pp heterojunction 18. This criterion is met if the electric field in region 12 is sufficiently low that minority carrier transport is by diffusion, and region 12 is at least three minority carrier diffusion lengths, or in excess of ~150 μm for $[N_A]-[N_D]$ above $1 \times 10^{17} cm^{-3}$. The alloy composition and doping level of region 14 changes gradually to those of region 16 over a distance of several hundred Angstroms to avoid the creation of a pronounced electron barrier. Region 14 is at least as long as an optical absorption length, but is shorter than or substantially equal to a minority carrier diffusion length, as has been mentioned.

Figure 2:
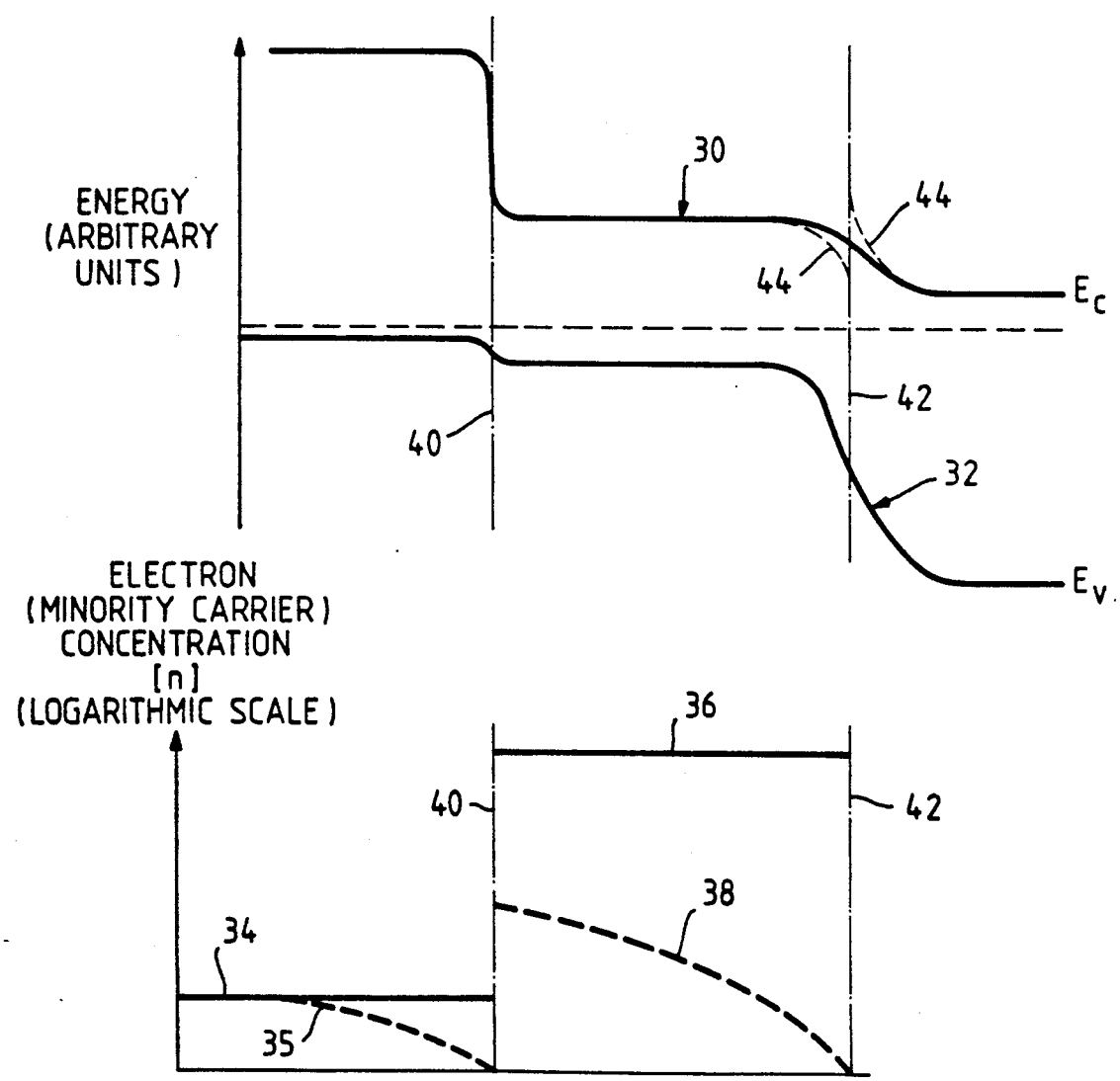
FIG. 2 illustrates the variation of the conduction and valence band edge energies and the minority carrier concentration along the device of the invention.

Referring to FIG. 2, there are shown diode properties depicted directly below corresponding regions of the diode 10 in FIG. 1. Graphs 30 and 32 respectively illustrate the approximate variation along the diode 10 of the conduction band edge energy $E_c$ and the valence band edge energy $E_v$ at zero bias. The minority carrier or electron concentrations [n] in regions 12 and 14 are indicated approximately on logarithmic scales by graphs 34, 35, 36 and 38, uninterrupted and broken lines corresponding to carrier concentrations for equilibrium (zero bias) and reverse bias conditions respectively. Chain lines 40 and 42 indicate the positions of excluding and extracting heterojunctions 18 and 20 respectively. A dotted region 44 of graph 30 indicates the position of an electron barrier which would have been formed at extracting heterojunction 20 in the absence of gradual change in the compositions and doping levels of regions 14 and 16 to merge them into one another.

The diode 10 operates as follows. As indicated in Table 1, the cut-off wavelength $\lambda_c$ in region 14 is much longer than that in either region 12 or region 16 since its bandgap is smaller. Radiation of wavelength intermediate the cut-off values of regions 16 and 14 passes through region 16 as indicated by arrow 26, and is absorbed in region 14. (It might also pass via region 12.) Electrode 22 is biased negatively with respect to electrode 24. The graded pn heterojunction 20 provides the characteristics of the diode 10, and is reverse biassed. It inhibits the reverse leakage current due to holes flowing from region 16 to region 14 by virtue of its carrier extraction properties. The pp heterojunction 18 provides as has been said an excluding contact; i.e. a contact of known kind in which holes (majority carriers) can flow freely from region 14 to region 12, but only a very small electron (minority carrier) current can flow from region 12 to region 14. When electrode 22 is biassed negatively, the electron density falls in region 14 as indicated by graphs 36 and 38. This is because electrons diffuse from region 14 to region 16 where the conduction band energy is lower (graph 30), but cannot be replaced from the excluding contact heterojunction 18. This produces the effect of a "weir" or sink to which diffusion takes place, but from which minority carrier return is inhibited. The result is a considerably lower minority carrier concentration in the photosensitive region 14 than the normal intrinsic level under equilibrium conditions. Accordingly, the effect of biasing is to produce a dynamic situation equivalent to extrinsic behaviour normally obtainable in infrared detectors only by the use of inconvenient and expensive cooling devices. Infrared detectors sensitive in the 8 to 12 μm wavelength region are normally cooled to 80° K., and those sensitive to 3 to 5 μm wavelengths to 200° K. The invention improves this to 200° K. and ambient temperature respectively, and accordingly provides an infrared detector having the characteristics of a prior art cooled device but with greatly reduced cooling requirements.

This example may be referred to as an Auger suppressed infrared diode detector, since it produces inter alia suppression of the semiconductor Auger effect previously mentioned.

Whereas the embodiment of FIGS. 1 and 2 has been described in terms of a heterostructure diode, the p and n regions 12 and 14 may be replaced by degenerately doped or p+ and n+ regions respectively. The latter provides a homostructure of three regions 12, 14, 16 of the same semiconductor material but with varying doping, and gives similar properties.

Referring now to FIGS. 3 and 4, there are shown alternative forms of means for inhibiting minority carrier injection into a device photosensitive region. FIGS. 3(a) and 3(b) are plan and side elevations of a photodetector 50 having a p region 52 and an n+ region 54 of the same semiconductor material. The extracting contact is the pn junction formed at 56 intermediate regions 52 and 54. The p region 52 has a constriction 58 between two subsidiary biasable n+ regions 60. Subsidiary pn junctions 62 are formed between the regions 60 and region 52. The distance (D) from the center of the constriction 58 to the junction 56 is substantially equal to or less than, and may preferably be very much less than, a minority carrier diffusion length L. A photosensitive region 64 is located between the constriction 58 and the extracting contact 56. Bias electrodes 66, 68 and 70 complete the device 50. A similar structure 80 is shown in FIGS. 4(a) and 4(b), respectively plan and side elevations once more. Here p and n+ regions 82 and 84 produce an intervening extracting pn junction contact 86, and a constriction 88 is produced by virtue of a subsidiary biasable n+ region 90 with associated subsidiary pn junction 92. The device 80 has a photosensitive region 94 between the constriction 88 and junction 86. Bias electrodes 96, 98 and 100 complete the device 80.

The device 50 operates as follows. Electrode 66 is biased negative and electrodes 68 and 70 are biased positive. This reverse biases the extracting contact or pn junction 56, and also the subsidiary pn junction 62. Minority carrier (electron) injection from electrode 66 into p region 52 (and so also into photosensitive region 64) is inhibited by the biased subsidiary pn junctions 62. Moreover, minority carrier extraction from photosensitive region 64 takes place by virtue of extracting contact 56. This greatly depresses the minority carrier concentration in photosensitive region 64. Similar effects occur in device 80. Referring now to FIG. 5, there is shown a schematic graph 110 of minority carrier (electron) concentration n plotted against distance x along photodetector 50 for the p region 52. Graph 110 corresponds to the device 50 under bias. FIG. 5 is shown on the same scale as and immediately below FIG. 3 to facilitate comparison. The graph 110 has a value $n_i$, the intrinsic minority carrier concentration, at $x=0$ where electrode 68 is located. The effect of subsidiary biased pn junctions 62 can be inferred by the fall in graph 110 from $n_i$ at $x=0$ to $x=x_1$ at the center of constriction 58. Thereafter, graph 110 is substantially constant and at a low value until reaching $x=x_2$ near the middle of photosensitive region 64. The extracting contact 56 is located at $x=x_3$, and from $x=x_2$ to $x_3$ (the right hand portion of photosensitive region 64) graph 110 reduces gradually to zero.

Graph 110 reflects the situation in which D, the length of the photosensitive region 64 previously mentioned and equal to $x_1-x_3$, is very much less than L, the minority carrier diffusion length in region 52. This is a preferred embodiment since the minority carrier extraction effect at contact 56 is maximised. Minority carrier extraction at an extracting contact takes place over a region extending a distance substantially equal to a minority carrier diffusion length from the contact, but the effect is greatest near the contact. The length D of the photosensitive region should therefore be not significantly more than a minority carrier diffusion length L, and preferably much less. If D>L, it means that the photosensitive region is not completely subject to minority carrier exclusion and its low noise benefits. As D increases beyond L, noise correspondingly increases. There is therefore no sharp change in noise properties, but instead a gradual worsening. Those skilled in the art of infrared detectors will appreciate that there is a trade-off between degree of noise and photosensitive area size to be resolved in individual detector applications.

Referring now to FIG. 6, there is shown a plan view of a further infrared detector 120 of the invention. The detector 120 comprises a large p region 122 with a circumferential negative bias electrode 124. The region 122 is provided with a two-dimensional regular array of in-diffused n+ regions 126. The latter give rise to pn junction extracting contacts (not shown) and are provided with positive bias electrodes (not shown). As illustrated, the array is hexagonal with an n+ region nearest neighbour spacing $D < < L$. The parameter D here corresponds approximately to the diameter of the respective photosensitive region extending roughly D/2 from each n+ region 126.

The FIG. 6 arrangement makes it possible to extend the minority carrier extraction effect without the limitation of diffusion length. Accordingly, photosensitive regions from which minority carriers are excluded may be extended indefinitely. In this case, all the n' regions 126 would be connected together to provide a common or summed photocurrent. Alternatively, the photocurrent from each region 126 may be detected separately to provide individual pixels for a two dimensional array. These approaches may be combined so that each pixel is the sum of outputs from several individual regions 126.

Parameters for CMT examples of the devices of FIGS. 3, 4 and 6 are as follows. The devices are made of $Cd_xHg_{1-x}Te$ where x is 0.265 or 0.19 for a 5 μm cut-off at ambient temperature of an 11 μm cut-off at 200° K. respectively. The doping level in all n regions should be sufficiently high ($10^{17}$ to $10^{18}$ cm$^{-3}$, typically $3 \times 7$ cm$^{-3}$) to retain extrinsic conduction at the operating temperature. The p or photosensitive region in each case should be lightly doped ($10^{15}-10^{16}$ cm$^{-3}$, typically $5 \times 10^{15}$ cm$^{-3}$) both to achieve intrinsic conduction at the operating temperature and to avoid limiting the minority carrier lifetime by Schockley-Read generation/recombination. In FIG. 6, the diameter of each n+ region 126 should be about 10 μm with a nearest neighbour separation of about 20 μm.

Referring now to FIG. 7, there is shown a sectional view (not to scale) of a photodetector 140 based on the FIG. 6 embodiment and arranged for ease of manufacture. The photodetector 140 has a photosensitive p region 142 with a top bias electrode structure 144 and in-diffused n+ regions 146 providing extracting contacts. The electrode structure 144 may be either an optically transmissive network of fine line conductors or an electrically conducting transparent layer. A bottom bias electrode structure 148 provides either or common connection to each n+ region 146. This arrangement is comparatively straightforward to produce by lithographic techniques. The thickness t of the p-region 142 is preferably much less than a diffusion length, as is the spacing between n+ regions 126. As indicated by arrow 150, the photodetector 140 is intended for top illumination.

In any of the foregoing examples of the invention, it is desirable to minimize the minority carrier generation rate at any surface of the photosensitive region. Means for achieving this by surface passivation are well known in the art of CMT detectors.

We claim:

1. A photodetector device having a given operating temperature and including:
   (1) a semiconducting first device region having a sufficiently low doping to produce predominantly intrinsic properties at the operating temperature when unbiased;
   (2) a semiconducting second device region of opposite majority carrier type to that of the first region, the second device region having sufficiently high doping to produce extrinsic properties at the operating temperature and forming with the first region a pn junction arranged to extract minority carriers from the first region when reverse biased;
   (3) a semiconductor third device region having an interface with the first region distant not more than one minority carrier diffusion length from the pn junction, the first region having no biase electrode between the interface and pn junction, the third region having sufficiently high doping to produce extrinsic properties at the operating temperature and to depress the first region minority carrier concentration when appropriately biased, and wherein the interface consists of any one of:
   (i) a homostructure pn junction,
   (ii) a heterostructure pn junction,
   (iii) an excluding contact between first and third region materials of like composition and majority carrier type, and
   (iv) an excluding contact between first and third region materials of different composition and like majority carrier type, the third region material having a wider bandgap than said first region; and
   (4) bias contacts arranged on the second and third regions.

2. A photodetector device according to claim 1 composed of at least one cadmium mercury telluride material.

3. A photodetector device according to claim 2 composed of a plurality of different mercury cadmium telluride materials, at least one adjacent pair of the said device regions having different material compositions.

4. A photodetector device according to claim 1 wherein the interface is at least one pn junction arranged to constrict bias current flow to the first region from a bias contact distant more than a minority carrier diffusion length from the pn junction between the first and second regions.

5. A photodetector device according to claim 1 wherein the interface is a pn junction equivalent to that between the first and the second regions, and the device includes additional pn junctions equivalent thereto and laterally spaced apart as appropriate to define a plurality of first regions therebetween.

6. A photodetector device according to claim 5 wherein the pn junctions have a nearest neighbor separation very much less than a minority carrier diffusion length.

7. A photodetector device according to claim 1 wherein the interface and pn junction are very much less than a minority carrier diffusion length apart.

* * * * *

UNITED STATES PATENT AND TRADEMARK OFFICE
CERTIFICATE OF CORRECTION

PATENT NO. : 5,016,073  Page 1 of 2
DATED     : May 14, 1991
INVENTOR(S) : Charles T. ELLIOTT et al.

It is certified that error appears in the above-indentified patent and that said Letters Patent is hereby corrected as shown below:

Column 2,   line 34,   after "cut-off wavelength" insert --$\lambda_c$--;
            line 58,   change "nn or pp" to --$\underline{n}$n or $\underline{p}$p--;
            line 59,   change "p or n" to --$\underline{p}$ or $\underline{n}$--.

Column 3,   line 25,   change "a p" to --a $\underline{p}$--;
            line 26,   change "p⁺" to --p⁻--;
            line 27,   change "or n" to --or $\underline{n}$--;
            line 29,   change "pp and p⁻n" to --$\underline{p}$p and p⁻$\underline{n}$--;
            line 31,   change "n or p" to --$\underline{n}$ or $\underline{p}$--;
            line 32,   change "pp" to --$\underline{p}$p--;
            line 36,   change "p⁻n" to --p⁻$\underline{n}$--;
            line 48,   change "Parameter" to --parameter--;
            line 61,   insert --TABLE 1--;
            line 65,   change "pp" to --$\underline{p}$p--.

Column 4,   line 6,    change "pn" to --p$\underline{n}$--;
            line 10,   change "pp" to --$\underline{p}$p--;
            line 52,   change "pp" to --$\underline{p}$p--.

Column 5,   line 16,   change "p and" to --$\underline{p}$ and--;
            line 17,   change "n regions" to --$\underline{n}$ regions--.

UNITED STATES PATENT AND TRADEMARK OFFICE
CERTIFICATE OF CORRECTION

PATENT NO. : 5,016,073

DATED : May 14, 1991

INVENTOR(S) : Charles T. Elliott, et al

It is certified that error appears in the above-indentified patent and that said Letters Patent is hereby corrected as shown below:

Column 6, line 60, change "$3 \times 7 \text{ cm}^{-3}$" to --$3 \times 10^{17} \text{ cm}^{-3}$--.

Signed and Sealed this

Twenty-sixth Day of July, 1994

Attest:

BRUCE LEHMAN

Attesting Officer     Commissioner of Patents and Trademarks